(12) United States Patent
Molin et al.

(10) Patent No.: US 10,490,489 B2
(45) Date of Patent: Nov. 26, 2019

(54) CONDUCTIVE CLIP CONNECTION ARRANGEMENTS FOR SEMICONDUCTOR PACKAGES

(71) Applicant: Silanna Asia Pte Ltd, Singapore (SG)

(72) Inventors: Stuart B. Molin, Carlsbad, CA (US); Laxminarayan Sharma, San Diego, CA (US)

(73) Assignee: Silanna Asia Pte Ltd, Singapore (SG)

( * ) Notice: Subject to any disclaimer, the term of this patent is extended or adjusted under 35 U.S.C. 154(b) by 0 days.

(21) Appl. No.: 16/185,800

(22) Filed: Nov. 9, 2018

(65) Prior Publication Data
US 2019/0080989 A1 Mar. 14, 2019

Related U.S. Application Data

(63) Continuation of application No. 15/402,099, filed on Jan. 9, 2017, now Pat. No. 10,128,170.

(51) Int. Cl.
*H01L 23/495* (2006.01)
*H01L 21/48* (2006.01)

(52) U.S. Cl.
CPC .... *H01L 23/49524* (2013.01); *H01L 21/4825* (2013.01); *H01L 23/49503* (2013.01);
(Continued)

(58) Field of Classification Search
CPC ......... H01L 23/49524; H01L 23/49503; H01L 23/49541; H01L 23/49537; H01L 23/49562; H01L 23/49575; H01L 24/37; H01L 24/40; H01L 24/41; H01L 24/81; H01L 24/84; H01L 24/39; H01L 25/117; H01L 24/36
(Continued)

(56) References Cited

U.S. PATENT DOCUMENTS 6,198,163 B1 3/2001 Crowley et al.
6,753,597 B1 6/2004 Crowley et al.
(Continued)

FOREIGN PATENT DOCUMENTS

| EP | 1911092 B1 | 5/2010 |
|---|---|---|
| JP | 2005354105 A | 12/2005 |
| JP | 2015072942 A | 4/2015 |

OTHER PUBLICATIONS

AND9137/D—Universal Footprint for SO8FL Package, ON Semiconductor, Feb. 2015 (http://www.onsemi.com/pub_link/Collateral/AND9137-D.PDF).
(Continued)

*Primary Examiner* — Mouloucoulaye Inoussa
(74) *Attorney, Agent, or Firm* — MLO, a professional corp.

(57) ABSTRACT

Conductive clip connection arrangements for semiconductor packages are disclosed. Some examples provide electrically conductive clip connection arrangements for semiconductor packages that improve electrical performance and fabrication reliability while maintaining compatibility with existing quality control processes. Some examples provide innovative conductive clip structures and die pad arrangements that broaden the range of options available for tailoring the physical configurations of one or more of the constituent conductive clips and/or die pads to achieve specific electrical performance targets.

15 Claims, 5 Drawing Sheets

(52) U.S. Cl.
CPC .. *H01L 23/49541* (2013.01); *H01L 23/49548* (2013.01); *H01L 23/49562* (2013.01); *H01L 2224/05554* (2013.01); *H01L 2224/0603* (2013.01); *H01L 2224/32245* (2013.01); *H01L 2224/40245* (2013.01); *H01L 2224/48247* (2013.01); *H01L 2224/73265* (2013.01)

(58) Field of Classification Search
USPC .......................... 257/676, 686, 777; 438/109
See application file for complete search history.

(56) References Cited

U.S. PATENT DOCUMENTS

| | | | |
|---|---|---|---|
| 8,436,460 | B1 | 5/2013 | Gamboa et al. |
| 8,841,167 | B1 | 9/2014 | Gong et al. |
| 2004/0021220 | A1* | 2/2004 | Kubo .................. H01L 23/3677 257/706 |
| 2006/0113646 | A1 | 6/2006 | Channabasappa et al. |
| 2007/0246808 | A1 | 10/2007 | Ewe et al. |
| 2008/0036078 | A1 | 2/2008 | Herbsommer et al. |
| 2008/0044946 | A1 | 2/2008 | Cruz et al. |
| 2008/0277772 | A1 | 11/2008 | Groenhuis et al. |
| 2009/0121330 | A1 | 5/2009 | Cruz |
| 2009/0121331 | A1 | 5/2009 | Cruz |
| 2010/0032819 | A1 | 2/2010 | Liu et al. |
| 2010/0090331 | A1* | 4/2010 | Joshi .................... H01L 23/492 257/692 |
| 2010/0155915 | A1 | 6/2010 | Bell et al. |
| 2010/0200973 | A1 | 8/2010 | Schravendeel et al. |
| 2011/0095411 | A1 | 4/2011 | Herbsommer et al. |
| 2012/0168922 | A1 | 7/2012 | Cho et al. |
| 2012/0168924 | A1 | 7/2012 | Cho et al. |
| 2012/0168926 | A1 | 7/2012 | Cho et al. |
| 2012/0187562 | A1 | 7/2012 | Hisada et al. |
| 2012/0292753 | A1 | 11/2012 | Cho |
| 2012/0292754 | A1 | 11/2012 | Cho |
| 2013/0257524 | A1 | 10/2013 | Cho et al. |
| 2014/0042599 | A1 | 2/2014 | Wu et al. |
| 2014/0264804 | A1* | 9/2014 | Terrill ..................... H01L 24/37 257/676 |
| 2014/0361419 | A1 | 12/2014 | Xue et al. |
| 2014/0361420 | A1 | 12/2014 | Yilmaz et al. |
| 2015/0279821 | A1* | 10/2015 | Cho .................. H01L 23/49524 257/288 |
| 2015/0311144 | A1 | 10/2015 | Williams et al. |
| 2015/0380384 | A1 | 12/2015 | Williams et al. |
| 2016/0172283 | A1 | 6/2016 | Cho |
| 2016/0300811 | A1 | 10/2016 | Standing |

OTHER PUBLICATIONS

Huang, Fabrication process & automation of power devices using Clip die bonder, 3S silicon tech., Inc., downloaded Oct. 19, 2016 (http://www.sss-tech.com.tw/english/pdf/a01.pdf).
International Search Report dated Apr. 25, 2018 for PCT Patent Application No. PCT/IB2018/050092.
LFPAK—The Toughest Power-SO8, NXP, downloaded Oct. 19, 2016 (http://www.nxp.com/documents/leaflet/75016838.pdf).
Notice of Allowance dated Jul. 20, 2018 for U.S. Appl. No. 15/402,099.
Office Action dated Feb. 22, 2018 for U.S. Appl. No. 15/402,099.
SO8-FL Data Sheet, Amkor Technology, Jul. 2016.

* cited by examiner

CONDUCTIVE CLIP CONNECTION ARRANGEMENTS FOR SEMICONDUCTOR PACKAGES

RELATED APPLICATIONS

This application is a continuation of U.S. patent application Ser. No. 15/402,099 filed on Jan. 9, 2017, and entitled "Conductive Clip Connection Arrangements for Semiconductor Packages", which is hereby incorporated for all purposes.

BACKGROUND

A typical semiconductor package includes a semiconductor die encapsulated in an insulating mold compound with a leadframe structure that provides external electrical connections for individual devices or integrated circuits formed in the semiconductor die. The leadframe structure typically includes a central paddle surrounded by leads. The semiconductor die typically is mounted on the paddle and die pads on the semiconductor die are electrically connected to respective ones of the leads.

In many cases, thin bond wires are used to electrically connect the die pads on the semiconductor die to the leads. Bond wire connections, however, are characterized by relatively low current carrying capacity, high resistance, and high inductance, making them unsuitable for high power semiconductor applications, such as power switching or power handling, which require electrical connections between the die pads and the package leads that are characterized by high current carrying capacity, low resistance, and/or low inductance. For these reasons, efforts have been made to use electrically conductive ribbon or pre-formed clips composed of copper, copper alloy, or aluminum instead of bond wires for high power electrical connections within semiconductor packages.

Although electrically conductive ribbons and clips address the needs of increasing current carrying capacity and reducing resistance and inductance compared with bond wires, further optimizations of semiconductor package performance for high power semiconductor applications are possible.

SUMMARY

In some examples, a semiconductor package includes a leadframe, a semiconductor die, and first and second electrically conductive clips. In these examples, the leadframe includes an electrically conductive paddle and perimeter package leads. The semiconductor die is attached to the paddle and includes a plurality of die pads. The first electrically conductive clip electrically connects a first one of the die pads to the paddle, where the first electrically conductive clip includes a first planar portion that overlies at least a portion of the first die pad. The second electrically conductive clip electrically connects a second one of the die pads to a first one of the perimeter package leads. The second electrically conductive clip includes a second planar portion that overlies at least a portion of the second die pad. The first and second planar portions of the first and second electrically conductive clips are spaced apart and intersected by a common plane.

In some examples, a semiconductor package includes a leadframe, a semiconductor die, and first and second electrically conductive clips. In these examples, the leadframe includes an electrically conductive paddle and perimeter package leads. The leadframe includes a paddle and a plurality of perimeter package leads. The semiconductor die is attached to the paddle and includes die pads. The first electrically conductive clip electrically connects a first one of the die pads to an external connection of the semiconductor package. The second electrically conductive clip electrically connects a second one of the die pads to a first one of the perimeter package leads. In a top orthographic view of the first and second electrically conductive clips, the first electrically conductive clip is characterized by a perimeter and the second electrically conductive clip is spaced apart from and extends more than halfway around the perimeter of the first electrically conductive clip.

In some examples, a semiconductor package includes a leadframe, a semiconductor die, and first and second electrically conductive clips. In these examples, the leadframe includes an electrically conductive paddle and first and second electrical connection locations electrically connected to respective external terminals of the semiconductor package. The electrically conductive paddle includes a planar surface bordered by sides, and the first and second electrical connection locations are nearer to one side of the paddle than to other sides of the paddle. The semiconductor die is attached to the paddle surface and includes a distal die pad, and a proximal die pad interposed between the distal die pad and the first and second electrical connection locations. The first electrically conductive clip electrically connects the proximal die pad to the first electrical connection location. The first electrically conductive clip includes a first planar portion that at least partially extends over a top surface of the proximal die pad. The second electrically conductive clip electrically connects the distal die pad to the second electrical connection location and includes a second planar portion that at least partially extends over a top surface of the distal die pad and circumnavigates the first clip. The first and second planar portions of the first and second clips are spaced apart and intersected by a common plane.

In some examples, a semiconductor die is packaged. In this process, a semiconductor die that includes a plurality of die pads is bonded to an electrically conductive paddle of a leadframe that includes a plurality of perimeter package leads. A first planar portion of a first electrically conductive clip is coupled to a first one of the die pads, and a second portion of the first electrically conductive clip is coupled to the paddle. A third planar portion of a second electrically conductive clip is connected to a second one of the die pads, and a fourth portion of the second electrically conductive clip is connected to a first one of the plurality of perimeter package leads, where the first planar portion of the first electrically conductive clip and the third planar portion of the second electrically conductive clip are spaced apart and intersected by a common plane.

In some examples, a semiconductor die is packaged. In this process, a semiconductor die that includes die pads is bonded to an electrically conductive paddle of a leadframe that includes a plurality of perimeter package leads. A first one of the die pads is coupled to an external connection of the semiconductor package with a first electrically conductive clip. A second one of the die pads is connected to a first one of the perimeter package leads with a second electrically conductive clip. In a top orthographic view of the first and second electrically conductive clips, the first electrically conductive clip is characterized by a perimeter and the second electrically conductive clip is spaced apart from and extends more than halfway around the perimeter of the first electrically conductive clip.

DETAILED DESCRIPTION

In the following description, like reference numbers are used to identify like elements. Furthermore, the drawings are intended to illustrate major features of exemplary embodiments in a diagrammatic manner. The drawings are not intended to depict every feature of actual embodiments nor relative dimensions of the depicted elements, and are not drawn to scale.

The examples that are described herein provide electrically conductive clip connection arrangements for semiconductor packages that improve electrical performance and fabrication reliability while maintaining compatibility with existing quality control processes. In some examples, the physical dimensions of one or more of the constituent conductive clips in a connection arrangement may be selected to achieve current carrying capacity, resistance, and/or inductance properties of the constituent electrically conductive clips that improve the overall semiconductor package performance. For example, a constituent conductive clip providing an electrical connection from a die contact to an external electrical ground terminal may be configured to have a length to width ratio less than 1 to provide a low-resistance, low-inductance connection to the ground terminal. In some examples, a constituent conductive clip in a connection arrangement may be configured to provide multiple conductive paths from a die contact to an external electrical connection (e.g., a perimeter package lead or other externally exposed contact or surface). In some examples, portions of respective ones of the constituent conductive clips in a connection arrangement are spaced apart and coplanar at least at locations overlying targeted critical feature locations to improve fabrication reliability while maintaining compatibility with existing quality control processes.

Figure 1:
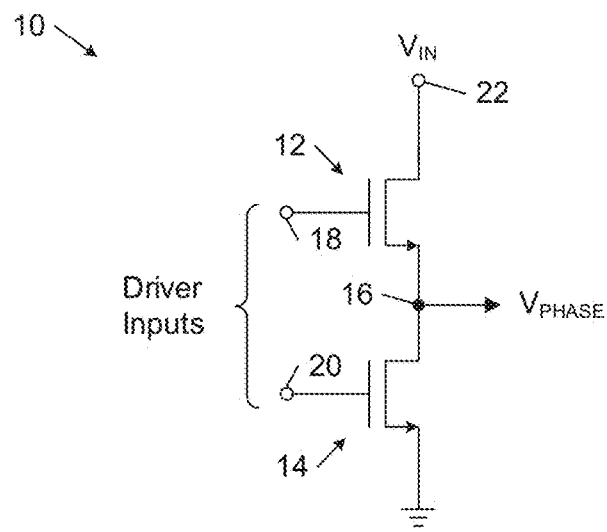
FIG. 1 is a circuit diagram of an example of a high power semiconductor switch.

FIG. 1 shows an example of a high power semiconductor switch circuit 10 that includes a high-side field effect transistor (FET) 12 and a low-side FET 14. The source of the high-side FET 12 is coupled to the drain of the low-side FET 14 at a switch node 16. The driver input terminals 18, 20 control the duty cycles of the high-side FET 12 and the low-side FET 14 to convert the input voltage ($V_{IN}$) at the input node 22 to a particular output voltage ($V_{PHASE}$) at the switch node 16. In general, the FETs 12, 14 may be fabricated using any of a wide variety of semiconductor material systems and technologies, including silicon, germanium, and compound semiconductor technologies.

Figure 2:
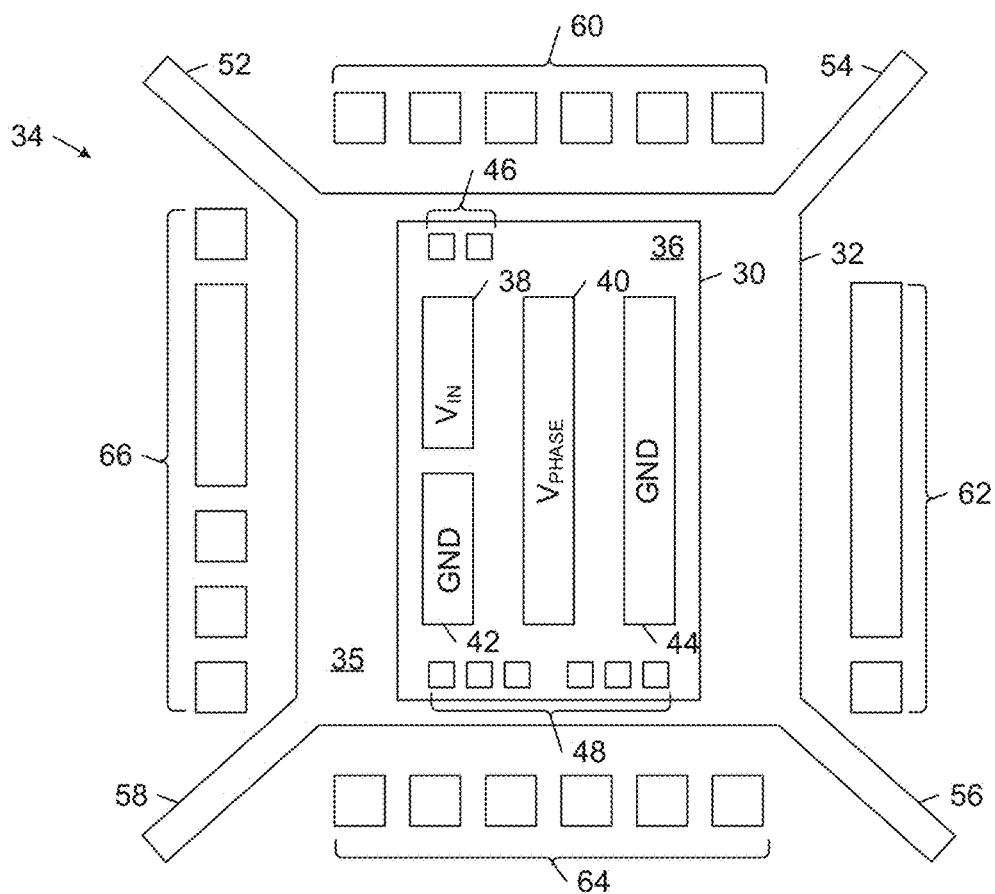
FIG. 2 is a diagrammatic top orthographic view of an example of a semiconductor die embodying the high power semiconductor switch of FIG. 1 bonded to a paddle of a leadframe structure.

FIG. 2 shows a diagrammatic top orthographic view of an example of a semiconductor die 30 embodying the high power semiconductor switch circuit 10 of FIG. 1 bonded to a paddle 32 portion of a leadframe structure 34. In the illustrated example, the paddle 32 has a rectangular top surface 35 that is bordered by four sides. The semiconductor die 30 is attached to the paddle 32 by a die-attach adhesive or material, such as a solder paste. The semiconductor die 30 includes a top surface 36 through which a number of die pads 38, 40, 42, 44, 46, and 48 are exposed. In the illustrated example, the die pads 38, 40, and 42-44 correspond to respective ones of the $V_{IN}$, $V_{PHASE}$, and ground (GND) terminals of the high power semiconductor switch circuit 10 shown in FIG. 1, the die pads 46 correspond to the driver input terminals 18, 20, and the die pads 48 correspond to other input/output terminals. The leadframe structure 34 also includes a set of four tie bars 52, 54, 56, 58 that attach the corners of the paddle 32 to the semiconductor package, and four sets 60, 62, 64, 66 of perimeter package leads.

Figure 3A:
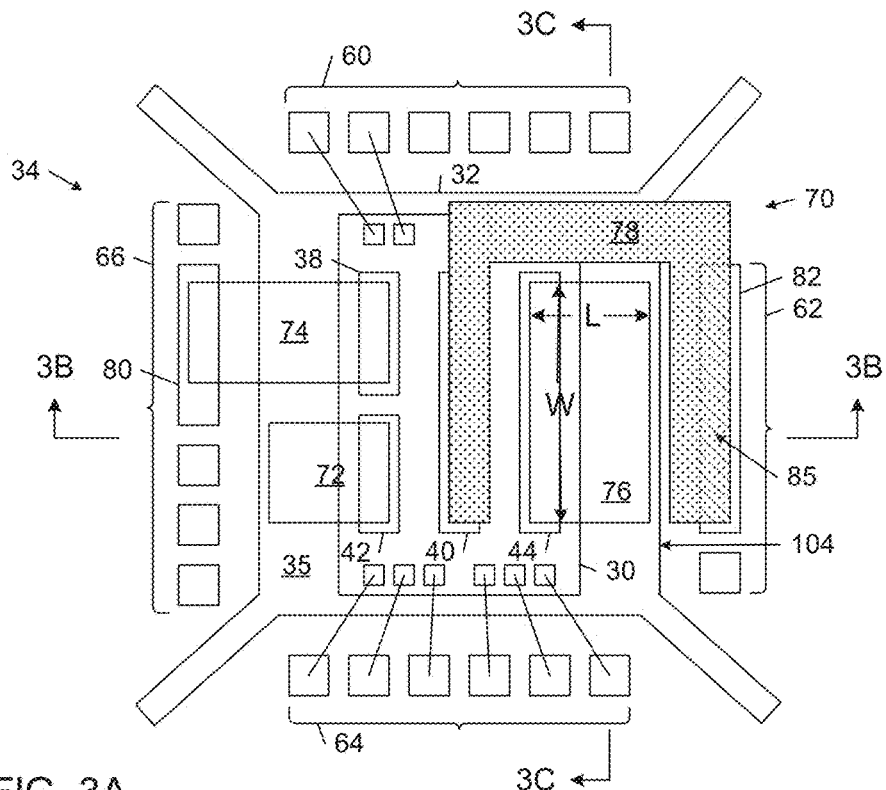
FIG. 3A is a diagrammatic top orthographic view of an example of a conductive clip arrangement electrically connecting die pads on the semiconductor die of FIG. 2 to the leadframe structure of FIG. 2.

FIG. 3A shows a diagrammatic top orthographic view of an example of a conductive clip arrangement 70 that electrically connects die pads on the semiconductor die 30 to the leadframe structure 34 (see FIG. 2). As mentioned above, the leadframe structure 34 includes the electrically conductive paddle 32 and the perimeter package lead sets 60-66, and the semiconductor die 30 is attached to the top surface 35 of the paddle 32. The conductive clip arrangement 70 includes a first electrically conductive clip 72, a second electrically conductive clip 74, a third electrically conductive clip 76, and a fourth electrically conductive clip 78. The first electrically conductive clip 72 electrically connects the die pad 42 (GND) to the top surface 35 of the paddle 32, which electrically connects to an external ground connection as explained in detail below. The second electrically conductive clip 74 electrically connects the die pad 38 ($V_{IN}$) to a perimeter package lead 80 (in the perimeter package lead set 66), which corresponds to the input node 22 in the circuit shown in FIG. 1. The third electrically conductive clip 76 electrically connects the die pad 44 (GND) to the top surface 35 of the paddle 32. The fourth electrically conductive clip 78 electrically connects the die pad 40 ($V_{PHASE}$) to a perimeter package lead 82 (in the perimeter package lead set 62), which corresponds to the node 16 in the high power semiconductor switch circuit 10 shown in FIG. 1. The electrically conductive clips 72-78 may be attached to the die pads 38-44, the paddle 32, and the perimeter package leads 80, 82 in any of a variety of ways, including an adhesive material such as a solder paste.

In some examples, the top surface 35 of the paddle 32 is electrically connected to an externally exposed electrically conductive surface of the semiconductor package. In some of these examples, the paddle 32 is composed of an electrically conductive material, such as copper or copper alloy, and has a bottom surface (not shown) that is exposed at the bottom side of the semiconductor package. The exposed bottom surface of the paddle 32 may be mounted on an electrically and thermally conductive thermal landing on the top surface of a printed circuit board (PCB). In some examples, the thermal landing typically may be connected to a plurality of underlying vias that extend through the PCB. The vias typically are either metal-plated or filled with an electrically and thermally conducting metal. In some examples, the metal-containing vias are electrically connected to a ground plane in the PCB, which thereby electrically grounds the top surface 35 of the paddle 32 through its electrical connection to the body of the paddle 32, the thermal landing, the metal-containing vias and their respective electrical connections to the ground plane of the PCB.

Thus, instead of making the die pad ground connections to package leads, the die pad ground connections may be made through the paddle 32. In this way, the ground connections through the paddle 32 enables the conductive clip arrangement 70 to use substantially shorter lengths for the first and third electrically conductive clips 72, 76, thereby increasing performance by reducing the resistance and inductance of their respective connections.

Figure 3B:
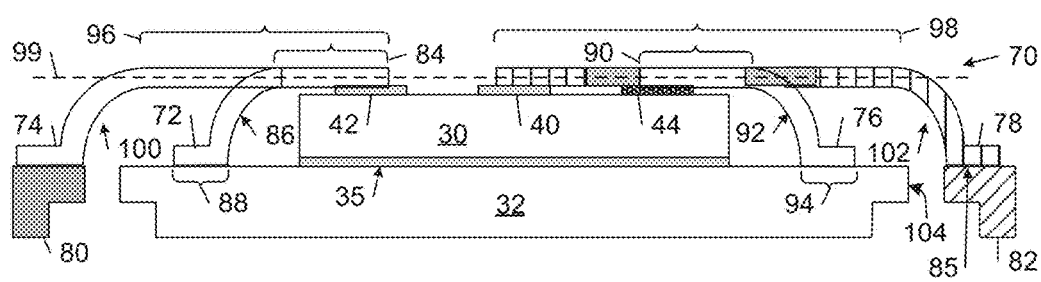
FIG. 3B is a diagrammatic cross-sectional view of the conductive clip arrangement, semiconductor die, and leadframe structure of FIG. 3A taken along the line 3B-3B.

FIG. 3B shows a diagrammatic cross-sectional view of the conductive clip arrangement 70, the semiconductor die 30, and leadframe structure 34 of FIG. 3A taken along the line 3B-3B. As shown in this view, the first electrically conductive clip 72 includes a planar portion 84 that overlies at least a portion of the die pad 42 (GND) and an arcuate (or curved) portion 86 that extends to a connection location 88 on the top surface 35 of the paddle 32. Similarly, the third electrically conductive clip 76 includes a planar portion 90 that overlies at least a portion of the die pad 44 (GND) and an arcuate (or curved) portion 92 that extends to a connection location 94 on the top surface 35 of the paddle 32. In some examples, the connection locations 88, 94 respectively correspond to contact pads on the top surface 35 of the paddle 32. In other examples, the connection locations 88, 94 respectively correspond to undifferentiated regions on the top surface 35 of the paddle 32. The second and fourth electrically conductive clips 74, 78 also include respective planar portions 96 and 98 that overlie at least respective portions of the die pads 38 and 40, as well as respective arcuate portions 100, 102 that extend to make electrical connections with respective ones of the perimeter package leads.

As shown in FIGS. 3A-3B, the planar portions 84, 96, 90, 98 of the first, second, third, and fourth electrically conductive clips 72, 74, 76, 78 are spaced apart and intersected by a common plane 99. These features are important for achieving high fabrication reliability while maintaining compatibility with existing quality control processes. In particular, maintaining coplanarity between the spaced-apart planar die-side connection portions 84, 96, 90, 98 of the electrically conductive clips 72-78 increases manufacturing yields by improving the reliability with which the clips 72-78 can be attached to the coplanar top surfaces of the respective die pads 38-44. These features also improve quality assurance testing by enabling testing equipment, such as optical and ultrasound inspection equipment, to access the critical feature locations beneath the conductive clips 72-78 after they have been attached.

In some examples, due to normal manufacturing variations or the like, the planar portions 84, 96, 90, 98 of the electrically conductive clips 72, 74, 76, 78 may be slightly offset in a direction normal to the planar top surface of the semiconductor die 30. However, since the electrically conductive clips 72, 74, 76, 78 have respective thicknesses, they still may be considered to be coplanar so long as their respective planar portions 84, 96, 90, 98 are intersected by a common plane, such as plane 99.

Referring to FIGS. 3A-3B, the third and fourth electrically conductive clips 76, 78 respectively connect the die pads 44 and 40 to a first electrical connection location 94 on the paddle and a second electrical connection location 85 on the perimeter package lead 82. In this case, the first and second electrical connection locations 94, 85 are nearer to one side 104 of the paddle 32 than to the other three sides of the paddle 32. In the illustrated example, the "distal" die pad 40 is located farther away from the first and second electrical connection locations 94, 85 than the "proximal" die pad 44. In addition, the proximal die pad 44 is interposed between the distal die pad 40 and the second electrical connection location 85 such that there is no direct straight-line route from the distal die pad 40 to the second electrical connection location 85. Therefore, in order to maintain the desired coplanarity of the planar portions 90, 98 of the third and fourth electrically conductive clips 76, 78, the fourth electrically conductive clip 78 circumnavigates the third electrically conductive clip 76 in the common plane 99.

As used herein, the amount by which a first clip "extends around" a second clip is given by the proportion of the perimeter of the first clip that is orthogonally adjacent to the second clip. In some examples, the second clip extends at least half (i.e., ≥50%) of the way around the first clip. In other examples, the second clip extends at least three quarters (i.e., ≥75%) of the way around the first clip. In still other examples, the second clip extends all (i.e., 100%) of the way around the first clip.

In some examples, the proportional extent ρ by which the first clip extends around the perimeter of the second clip is determined by measuring the proportion of the perimeter of the first clip that is orthogonally adjacent to the second clip in an orthographic top view of the first and second clips. For example, in the orthographic top view shown in FIG. 3A, the third electrically conductive clip 76 has a rectangular shape characterized by a length dimension L, a width dimension W, and a perimeter P=2×(L+W). In the illustrated example, the fourth electrically conductive clip 78 extends around the length of the perimeter of the third electrically conductive clip corresponding to twice the width dimension W plus the length dimension L. Therefore, the proportional extent ρ by which the fourth electrically conductive clip 78 extends around the perimeter P of the third electrically conductive clip 76 is given by ρ=(L+2W)/(2L+2W).

Figure 3C:
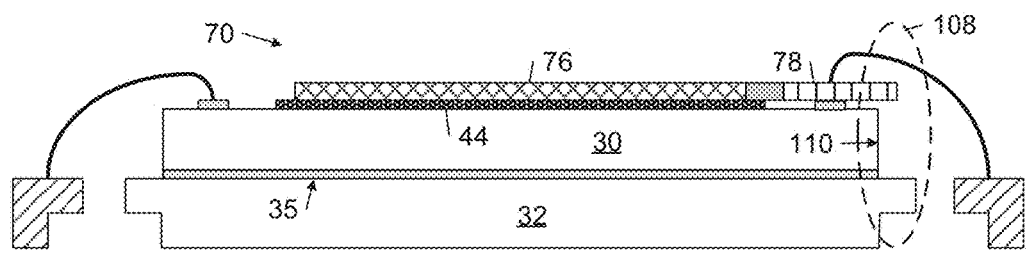
FIG. 3C is a diagrammatic cross-sectional view of the conductive clip arrangement, semiconductor die, and leadframe structure of FIG. 3A taken along the line 3C-3C.

FIG. 3C shows a diagrammatic cross-sectional view of the conductive clip arrangement 70, the semiconductor die 30, and leadframe structure 34 of FIG. 3A taken along the line 3C-3C. As shown in the region 108 in this view, at least a portion of the fourth electrically conductive clip 78 is suspended beyond the lateral extent 110 of the semiconductor die 30 and directly over one of the other sides of the paddle 32 that is perpendicular to the one side 104 of the paddle 32 with respect to which the first and second electrical connection locations 94, 85 are nearer. Expanding the permissible range of the fourth electrically conductive clip 78 beyond the lateral extent 110 of the semiconductor die 30 enables the width (W) of the high current carrying third electrically conductive clip 76 to be enlarged and thereby increases the current carrying capacity of the connection while reducing its resistance and inductance. In the illustrated example, the additional space is leveraged to configure the electrically conducting clip 76 to have a length (L) to width (W) ratio less than 1 to provide a low-resistance, low-inductance connection to the external ground connection provided by the paddle 32.

Figure 4:
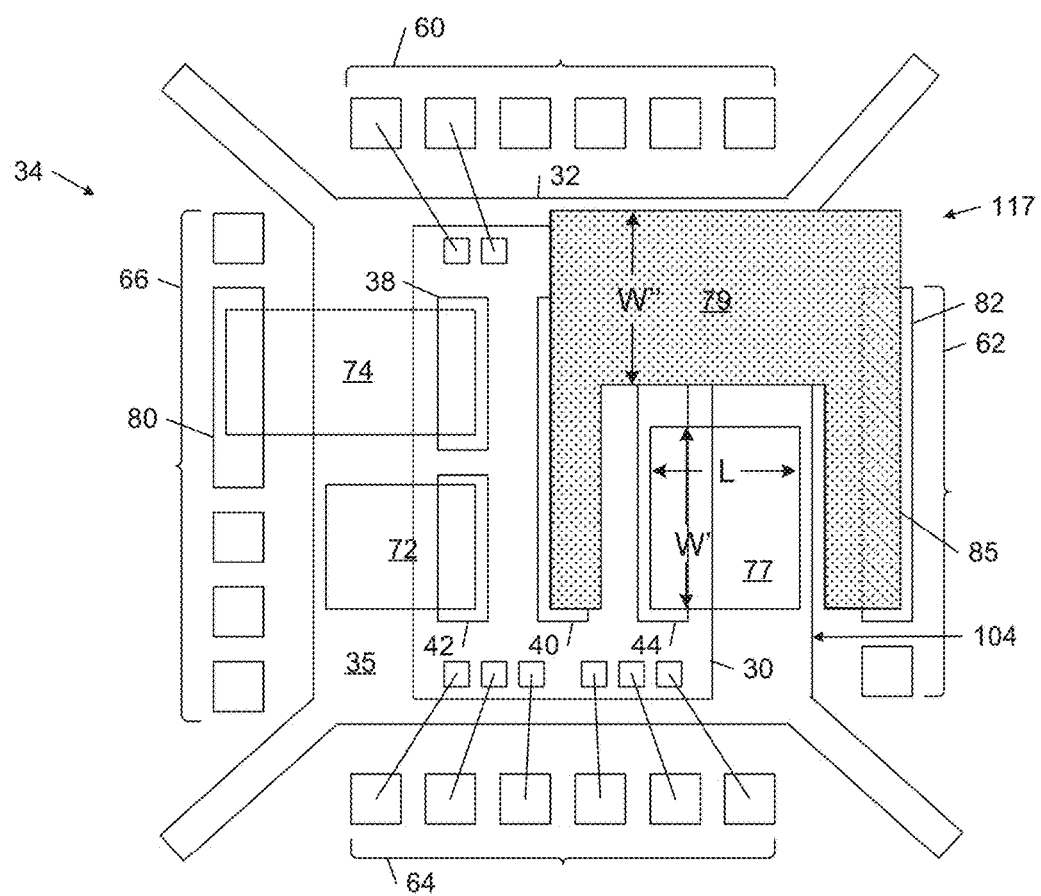
FIG. 4 is a diagrammatic top orthographic view of an example of a conductive clip arrangement electrically connecting die pads on the semiconductor die of FIG. 2 to the leadframe structure of FIG. 2.

FIG. 4 shows a diagrammatic top orthographic view of a second example of a conductive clip arrangement 117 that electrically connects die pads on the semiconductor die 30 to the leadframe structure 34 (see FIG. 2). The structure and arrangement of the elements of the second conductive clip arrangement 117 is the same as the structure and arrangement of the elements of the first conductive clip arrangement 70 except that the width (W') of the third conductive clip 77 in the second conductive clip arrangement 117 is shorter than the width (W) of the third conductive clip 76 in the first conductive clip arrangement 70 and the width (W") of the fourth conductive clip 79 in the second conductive clip arrangement 117 is shorter than the corresponding width of the fourth conductive clip 78 in the first conductive clip arrangement 70. The increased width (W") of the fourth conductive clip 79 reduces its electrical resistance and inductance and increases its structural integrity, thereby improving its electrical performance and increasing its manufacturability as compared with the fourth conductive clip 78 in the first conductive clip arrangement 70.

Figure 5A:
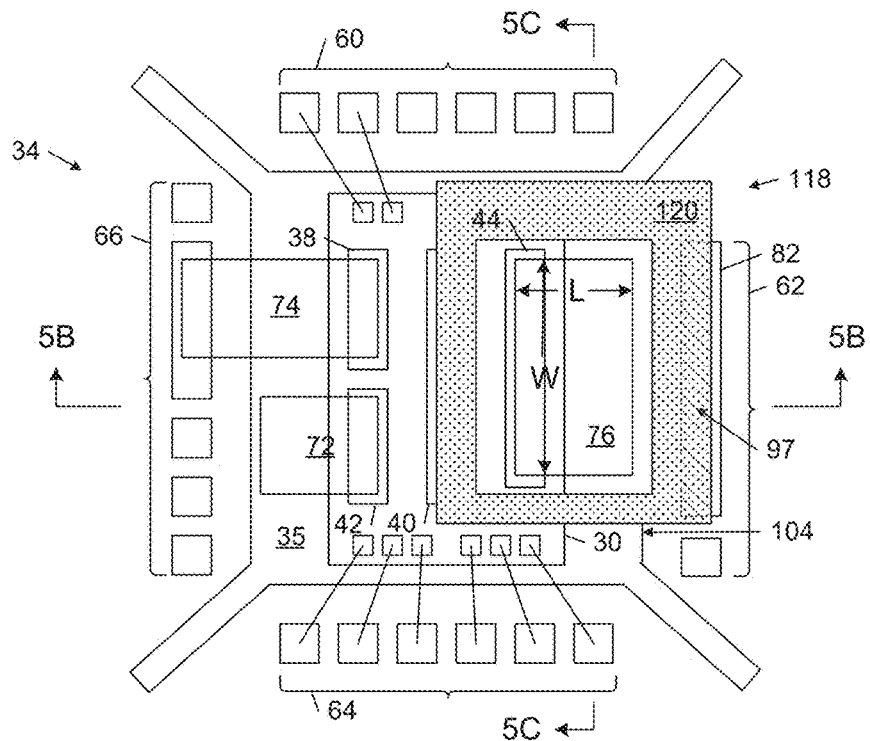
FIG. 5A is a diagrammatic top orthographic view of an example of a conductive clip arrangement electrically connecting die pads on the semiconductor die of FIG. 2 to the leadframe structure of FIG. 2.

FIG. 5A shows a diagrammatic top orthographic view of a third example 118 of a conductive clip arrangement that electrically connects die pads on the semiconductor die 30 to the leadframe structure 34 (see FIG. 2). As mentioned above, the leadframe structure 34 includes the electrically conductive paddle 32 and the perimeter package leads 60-66, and the semiconductor die 30 is attached to the top surface 35 of the paddle 32. The conductive clip arrangement 118 includes the first, second, and third electrically conductive clips 72-76 of the conductive clip arrangement 70 shown in FIGS. 3A-3C, and replaces the fourth electrically conductive clip 78 with a fifth electrically conductive clip 120 that electrically connects the die pad 40 ($V_{PHASE}$) to the perimeter package lead 82 (in the perimeter package lead set 62).

Figure 5B:
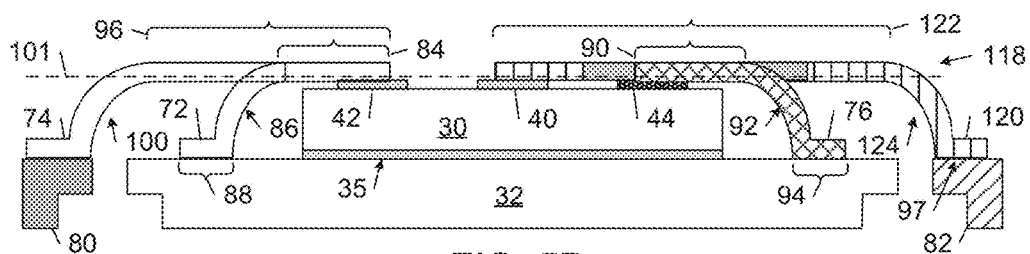
FIG. 5B is a diagrammatic cross-sectional view of the conductive clip arrangement, semiconductor die, and leadframe structure of FIG. 5A taken along the line 5B-5B.

FIG. 5B shows a diagrammatic cross-sectional view of the conductive clip arrangement 118, the semiconductor die 30, and leadframe structure 34 of FIG. 5A taken along the line 5B-5B. As shown in this view, the first electrically conductive clip 72 includes a planar portion 84 that overlies at least a portion of the die pad 42 (GND) and an arcuate (or curved) portion 86 that extends to a connection location 88 on the top surface 85 of the paddle 32. Similarly, the third electrically conductive clip 76 includes a planar portion 90 that overlies at least a portion of the die pad 44 (GND) and an arcuate (or curved) portion 92 that extends to a connection location 94 on the top surface 85 of the paddle 32. In some examples, the connection locations 88, 94 respectively correspond to contact pads on the top surface 85 of the paddle 32. In other examples, the connection locations 88, 94 respectively correspond to undifferentiated regions on the top surface 85 of the paddle 32. The second and fifth electrically conductive clips 74, 120 also include respective planar portions 96 and 122 that overlie at least respective portions of the die pads 38 and 40, as well as respective arcuate portions 100, 124 that extend to make electrical connection with respective ones of the perimeter package leads 80, 82.

As shown in FIGS. 5A-5B, the planar portions 84, 96, 90, 122 of the first, second, third, and fifth electrically conductive clips 72, 74, 76, 120 are spaced apart and intersected by a common plane 101. As explained above, these features are important for achieving high fabrication reliability while maintaining compatibility with existing quality control processes. In particular, maintaining coplanarity between the spaced-apart planar die-side connection portions 84, 96, 90, 122 of the electrically conductive clips 72-76, and 120 increases manufacturing yields by improving the reliability with which the clips 72-76, and 120 can be attached to the coplanar top surfaces of the respective die pads 38-44. These features also improve quality assurance testing by enabling testing equipment, such as optical and ultrasound inspection equipment, to access the critical feature locations beneath the conductive clips 72-76, and 120 after they have been attached.

Referring to FIGS. 5A-5B, the third and fifth electrically conductive clips 76, 120 respectively connect the die pads 44 and 40 to a first electrical connection location 94 on the paddle 32 and a second electrical connection location 97 on the perimeter package lead 82. In this case, the first and second electrical connection locations 94, 97 are nearer to one side 104 of the paddle 32 than to the other three sides of the paddle 32. In the illustrated example, the distal die pad 40 is located farther away from the first and second electrical connection locations 94, 97 than the proximal die pad 44. In addition, the proximal die pad 44 is interposed between the distal die pad 40 and the second electrical connection location 97 such that there is no direct straight-line route from the distal die pad 40 to the second electrical connection location 97. Therefore, in order to maintain the desired coplanarity of the planar portions 90, 122 of the third and fifth electrically conductive clips 76, 120, the fifth electrically conductive clip 120 circumnavigates the third electrically conductive clip 76 in the common plane.

In the example shown in FIG. 5A, the fifth electrically conductive clip 120 extends around the entirety (100%) of the perimeter of the electrically conductive clip 76 (i.e., $\rho=1$). The fifth electrically conductive clip 120 thereby provides multiple spaced-apart electrically conductive paths between the die pad 40 and the perimeter package lead 82. In this way, the fifth electrically conductive clip 120 increases the effective width of the electrically conductive path between the die pad 40 and the perimeter package lead 82 and thereby increases the effective current carrying capacity and reduces the resistance and inductance of the connection.

Figure 5C:
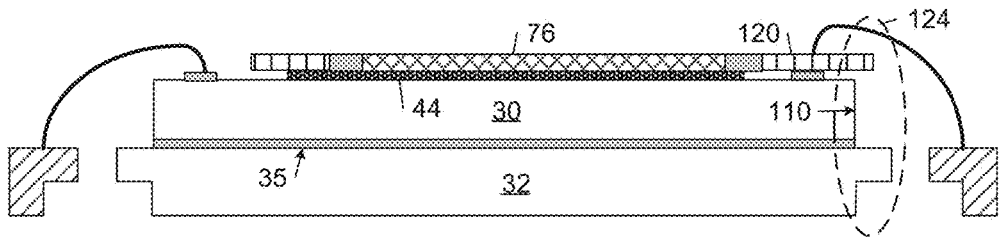
FIG. 5C is a diagrammatic cross-sectional view of the conductive clip arrangement, semiconductor die, and leadframe structure of FIG. 5A taken along the line 5C-5C.

FIG. 5C shows a diagrammatic cross-sectional view of the conductive clip arrangement 118, the semiconductor die 30, and leadframe structure 34 of FIG. 5A taken along the line 5C-5C. As shown in the region 124 in this view, at least a portion of the fifth electrically conductive clip 120 is suspended beyond the lateral extent 110 of the semiconductor die 30 and directly over one of the other sides of the paddle 32 that is perpendicular to the one side 104 of the paddle 32 with respect to which the first and second electrical connection locations 94, 97 are nearer. For essentially the same reasons explained above, expanding the permissible range of the fifth electrically conductive clip 120 beyond the lateral extent 110 of the semiconductor die 30 enables the width (W) of the high current carrying third electrically conductive clip 76 to be enlarged and thereby increases the current carrying capacity of the connection while reducing its resistance and inductance. In the illustrated example, the additional space was leveraged to configure the electrically conducting clip 76 to have a length (L) to width (W) ratio less than 1 to provide a low-resistance, low-inductance connection to the external ground terminal provided by the paddle 32.

Figure 6:
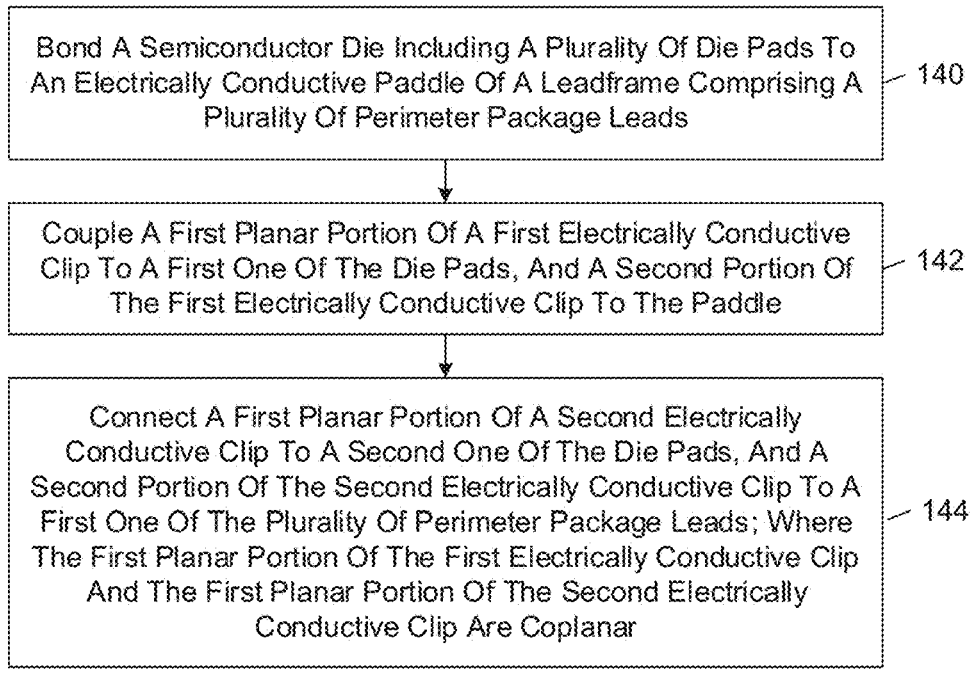
FIG. 6 is a flow diagram of an example of a method of fabricating a conductive clip connection arrangement in the semiconductor package structure shown in FIGS. 3A-3C.

FIG. 6 shows an example of a method of fabricating the conductive clip arrangement of the clips 72, 74 in semiconductor package structure shown in FIGS. 3A-3C. In accordance with this method, a semiconductor die 30 that includes a plurality of die pads 38-48 is bonded to an electrically conductive paddle 32 of a leadframe 34 that includes a plurality of perimeter package leads 60-66 (FIG. 6, block 140). A first planar portion 84 of a first electrically conductive clip 72 is coupled to a first one (42) of the die pads, and a second portion 86 of the first electrically conductive clip is coupled to the paddle 32 (FIG. 6, block 142). A third planar portion 96 of a second electrically conductive clip 74 is connected to a fourth one (38) of the die pads, and a second portion 100 of the second electrically conductive clip 74 is connected to a first one (80) of the plurality of perimeter package leads, where the first planar portion 84 of the first electrically conductive clip 72 and the third planar portion 96 of the second electrically conductive clip 74 are spaced apart and intersected by a common plane (FIG. 6, block 144).

Figure 7:
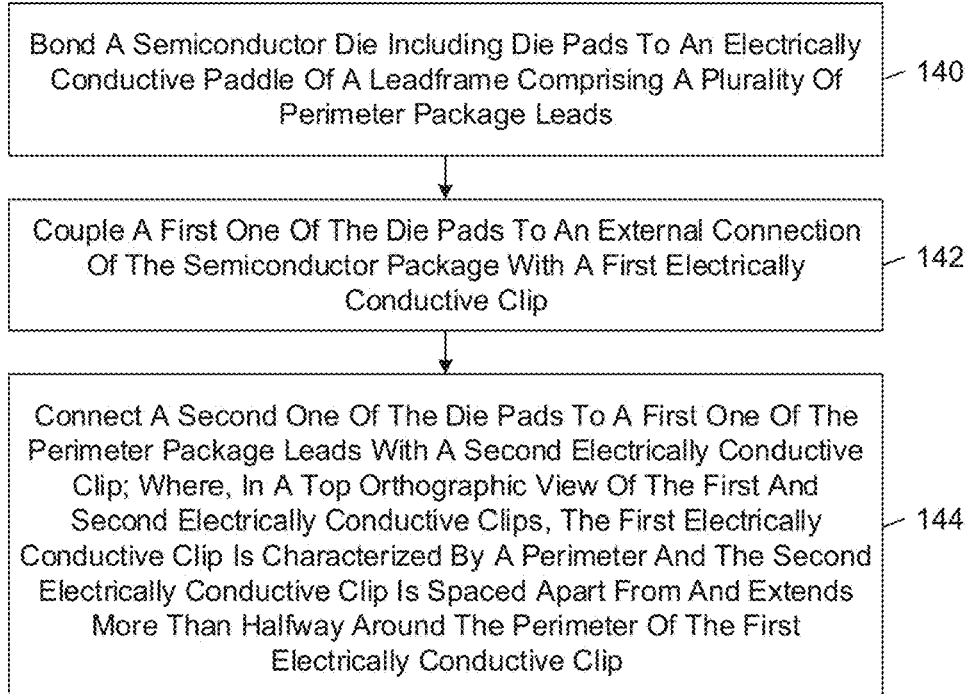
FIG. 7 is a flow diagram of an example of a method of fabricating a conductive clip connection arrangement in the semiconductor package structure shown in FIGS. 3A-3C.

FIG. 7 shows an example of a method of fabricating the conductive clip arrangement of the clips 76, 78 in semiconductor package structure shown in FIGS. 3A-3C. In accordance with this method, a semiconductor die 30 that includes a plurality of die pads 38-48 is bonded to an electrically conductive paddle 32 of a leadframe 34 that includes a plurality of perimeter package leads 60-66 (FIG. 7, block 150). A first one (44) of the die pads is coupled to an external connection of the semiconductor package with a first electrically conductive clip 76 (FIG. 7, block 152). A second one (40) of the die pads is connected to a first one (82) of the perimeter package leads with a second electrically conductive clip 78; where, in a top orthographic view of the first and second electrically conductive clips 76, 78, the first electrically conductive clip 76 is characterized by a perimeter and the second electrically conductive clip 78 is spaced apart from and extends more than halfway around the perimeter of the first electrically conductive clip 76 (FIG. 7, block 154).

While the specification has been described in detail with respect to specific embodiments of the invention, other embodiments are within the scope of the claims. It will be appreciated that those skilled in the art, upon attaining an understanding of the foregoing, may readily conceive of alterations to, variations of, and equivalents to these embodiments. These and other modifications and variations to the present invention may be practiced by those skilled in the art, without departing from the spirit and scope of the present invention, which is more particularly set forth in the appended claims.

What is claimed is:

1. A semiconductor package, comprising:
a leadframe comprising an electrically conductive paddle and perimeter package leads;
a semiconductor die attached to the electrically conductive paddle and comprising a plurality of die pads;
a single first electrically conductive clip electrically connecting a first die pad of the plurality of die pads to the electrically conductive paddle, wherein the first electrically conductive clip comprises a first planar portion overlying at least a portion of the first die pad, the first planar portion being of a first plane, and the electrically conductive paddle being of a second plane; and
a single second electrically conductive clip electrically connecting a second die pad of the plurality of die pads to a first perimeter package lead of the perimeter package leads, wherein the second electrically conductive clip comprises a second planar portion overlying at least a portion of the second die pad, the second planar portion being coplanar with the first plane;
wherein:
the first and second planar portions of the first and second electrically conductive clips are spaced apart within the first plane;
the first electrically conductive clip is characterized by a perimeter in the first plane, the perimeter circumnavigating the first planar portion; and
the second planar portion of the second electrically conductive clip extends at least three quarters (75%) around the perimeter of the first electrically conductive clip in a top orthographic view of the first and second electrically conductive clips.

2. The semiconductor package of claim 1, wherein:
the second electrically conductive clip provides multiple spaced-apart electrically conductive paths between the second die pad and the first perimeter package lead.

3. The semiconductor package of claim 1, wherein:
the electrically conductive paddle comprises an external connection of the semiconductor package, and the first die pad is electrically connected to the external connection through the first electrically conductive clip and the electrically conductive paddle.

4. The semiconductor package of claim 1, wherein:
in the top orthographic view of the first and second electrically conductive clips, the first electrically conductive clip has a length dimension that extends from the first die pad to the electrically conductive paddle, and a width dimension that is perpendicular to and greater than the length dimension.

5. The semiconductor package of claim 1, wherein:
the first electrically conductive clip has a planar rectangular surface bordered by four sides in the first plane; and
the second electrically conductive clip defines a rectangular electrically conductive path around at least three sides of the first electrically conductive clip in the top orthographic view of the first and second electrically conductive clips.

6. A semiconductor package, comprising:
a leadframe comprising an electrically conductive paddle and perimeter package leads;
a semiconductor die attached to the electrically conductive paddle and comprising a plurality of die pads;
a single first electrically conductive clip electrically connecting a first die pad of the plurality of die pads to an external connection of the semiconductor package, wherein the first electrically conductive clip comprises a first planar portion overlying at least a portion of the first die pad, the first planar portion being of a first plane, and the electrically conductive paddle being of a second plane; and
a single second electrically conductive clip electrically connecting a second die pad of the plurality of die pads to a first perimeter package lead of the perimeter package leads, wherein the second electrically conductive clip comprises a second planar portion overlying at least a portion of the second die pad, the second planar portion being coplanar with the first plane;
wherein:
the first and second planar portions of the first and second electrically conductive clips are spaced apart within the first plane;
the first electrically conductive clip is characterized by a perimeter in the first plane, the perimeter circumnavigating the first planar portion; and the second planar portion of the second electrically conductive clip extends at least three quarters (75%) around the perimeter of the first electrically conductive clip in a top orthographic view of the first and second electrically conductive clips.

7. The semiconductor package of claim 6, wherein:
the first electrically conductive clip electrically connects the first die pad to the electrically conductive paddle, and the first die pad is electrically connected to the external connection through the first electrically conductive clip and the electrically conductive paddle.

8. The semiconductor package of claim 6, wherein:
the second electrically conductive clip provides multiple spaced-apart electrically conductive paths between the second die pad and the first perimeter package lead.

9. The semiconductor package of claim 6, wherein:
in the top orthographic view of the first and second electrically conductive clips, the first electrically conductive clip has a length dimension that extends from the first die pad to the electrically conductive paddle, and a width dimension that is perpendicular to and greater than the length dimension.

10. The semiconductor package of claim 6, wherein:
the first electrically conductive clip has a planar rectangular surface bordered by four sides in the first plane; and
the second electrically conductive clip defines a rectangular electrically conductive path around at least three sides of the first electrically conductive clip in the top orthographic view of the first and second electrically conductive clips.

11. A method of packaging a semiconductor die, comprising:
bonding the semiconductor die to an electrically conductive paddle of a leadframe, the semiconductor die comprising a plurality of die pads, and the leadframe comprising a plurality of perimeter package leads;
coupling a first planar portion of a single first electrically conductive clip to a first die pad of the plurality of die pads and a second portion of the first electrically conductive clip to the electrically conductive paddle, the first planar portion being of a first plane, and the electrically conductive paddle being of a second plane; and
connecting a third planar portion of a single second electrically conductive clip to a second die pad of the plurality of die pads, and a fourth portion of the second electrically conductive clip to a first perimeter package lead of the plurality of perimeter package leads, the third planar portion being coplanar with the first plane;
wherein:
the first and second planar portions of the first and second electrically conductive clips are spaced apart within the first plane;
the first electrically conductive clip is characterized by a perimeter in the first plane, the perimeter circumnavigating the first planar portion; and
the third planar portion of the second electrically conductive clip extends at least three quarters (75%) around the perimeter of the first electrically conductive clip in a top orthographic view of the first and second electrically conductive clips.

12. The method of claim 11, wherein:
the second electrically conductive clip provides multiple spaced-apart electrically conductive paths between the second die pad and the first perimeter package lead.

13. The method of claim 11, wherein:
the electrically conductive paddle comprises an external connection of a semiconductor package that includes the semiconductor die and the leadframe; and
the first die pad is electrically connected to the external connection through the first electrically conductive clip and the electrically conductive paddle.

14. The method of claim 11, wherein:
in the top orthographic view of the first and second electrically conductive clips, the first electrically conductive clip has a length dimension that extends from the first die pad to the electrically conductive paddle, and a width dimension that is perpendicular to and greater than the length dimension.

15. The method of claim 11, wherein:
the first electrically conductive clip has a planar rectangular surface bordered by four sides in the first plane; and
the second electrically conductive clip defines a rectangular electrically conductive path around at least three sides of the first electrically conductive clip in the top orthographic view of the first and second electrically conductive clips.

* * * * *